(12) United States Patent
Beynet et al.

(10) Patent No.: US 8,252,691 B2
(45) Date of Patent: Aug. 28, 2012

(54) METHOD OF FORMING SEMICONDUCTOR PATTERNS

(75) Inventors: Julien Beynet, Kessel-lo (BE); Hyung Sang Park, Seoul (KR); Naoki Inoue, Tokyo (JP)

(73) Assignee: ASM Genitech Korea Ltd., Jiksan-Eup, Seobuk-Gu, Chungcheongnam-Do, Cheonan-Si (KR)

( * ) Notice: Subject to any disclaimer, the term of this patent is extended or adjusted under 35 U.S.C. 154(b) by 0 days.

(21) Appl. No.: 13/085,531

(22) Filed: Apr. 13, 2011

(65) Prior Publication Data

US 2011/0256727 A1 Oct. 20, 2011

Related U.S. Application Data

(60) Provisional application No. 61/323,918, filed on Apr. 14, 2010.

(51) Int. Cl.
*H01L 21/311* (2006.01)

(52) U.S. Cl. ............... 438/696; 438/709; 257/E21.027

(58) Field of Classification Search .................. 438/707, 438/726; 257/E21.023, E21.036
See application file for complete search history.

(56) References Cited

U.S. PATENT DOCUMENTS

| 2008/0076070 A1* | 3/2008 | Koh et al. ............ 430/311 |
| 2008/0277656 A1* | 11/2008 | Park et al. ............ 257/43 |
| 2010/0081094 A1 | 4/2010 | Hasebe et al. |

FOREIGN PATENT DOCUMENTS

JP  2009-016814  1/2009

* cited by examiner

*Primary Examiner* — Cheung Lee
(74) *Attorney, Agent, or Firm* — Lexyoume IP Meister, PLLC

(57) ABSTRACT

Semiconductor patterns are formed by performing trimming simultaneously with the process of depositing the spacer oxide. Alternatively, a first part of the trimming is performed in-situ, immediately before the spacer oxide deposition process in the same chamber in which the spacer oxide deposition is performed whereas a second part of the trimming is performed simultaneously with the process of depositing the spacer oxide. Thus, semiconductor patterns are formed reducing PR footing during PR trimming with direct plasma exposure.

14 Claims, 11 Drawing Sheets

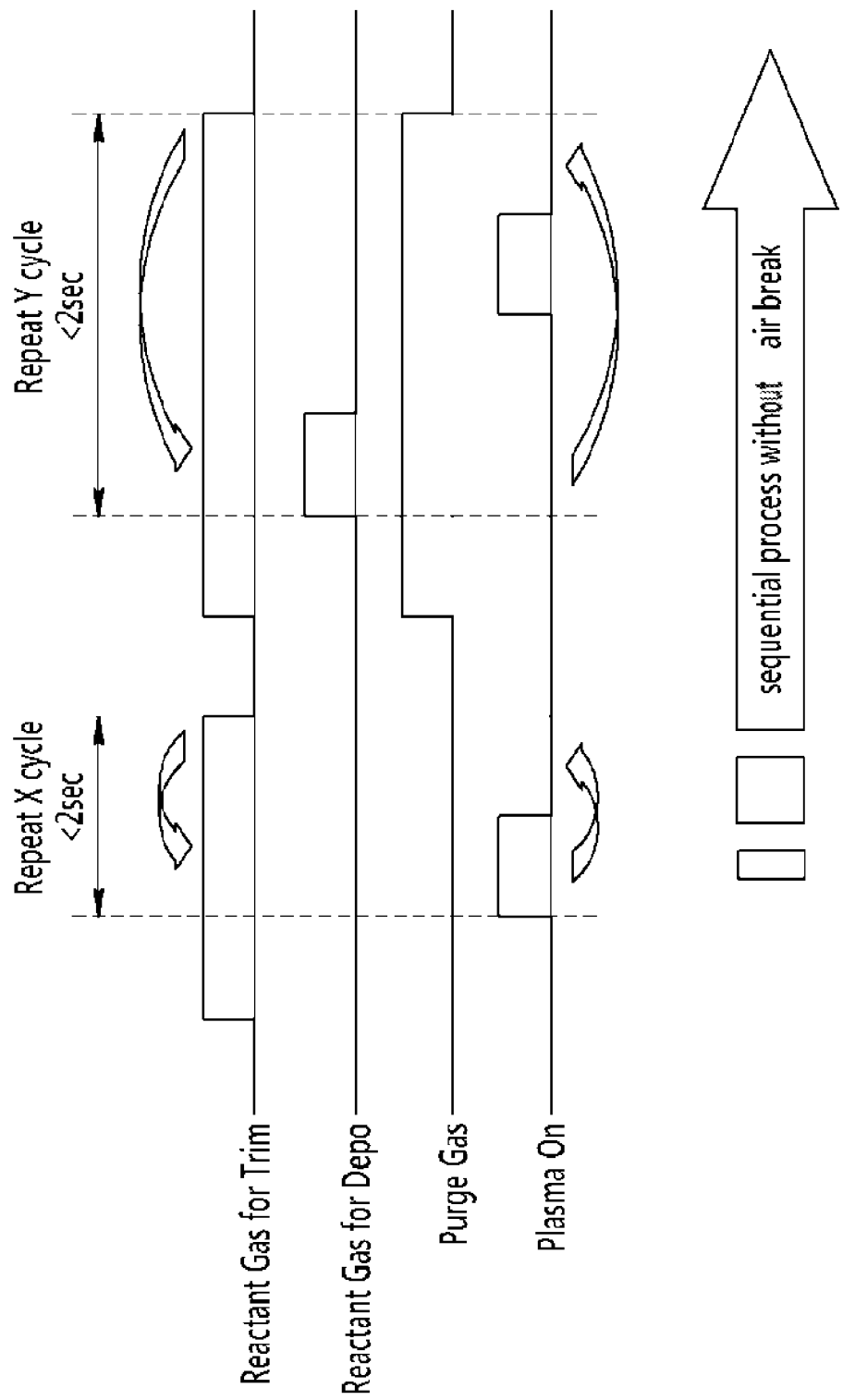

METHOD OF FORMING SEMICONDUCTOR PATTERNS

CROSS-REFERENCE TO RELATED APPLICATIONS

This application claims the benefit of U.S. Provisional Application No. 61/323,918, filed on Apr. 14, 2010, in the United States Patent and Trademark Office, the disclosure of which is incorporated herein in its entirety by reference.

BACKGROUND OF THE INVENTION (a) Field of the Invention

The present invention relates to a method of forming semiconductor patterns. More specifically, the present invention relates to a spacer defined double patterning (SDDP) process using a PEALD spacer oxide deposition process having trimming action.

(b) Description of the Related Art

Due to the limit of resolution of the immersion ArF lithography, the method of Double Patterning is used in the chip patterning process for 3× nm half pitch and below.

In the art, the method of Spacer Defined Double Patterning, as represented in FIGS. 1A-1D, is as follows. As shown in FIG. 1A, photo resist template patterns 2 are formed on top of a bottom layer 1. Here, the line width and the line spacing are in a ratio of about 1:3. As shown in FIG. 1B, an oxide spacer conformal 3 is deposited on the photo resist template patterns 2. Here, the thickness of the oxide film is equal to the width of template line.

Next, as shown in FIG. 1C, the deposited spacer oxide film 3 is etched back by RIE (reactive ion etching) such that film on the upper and bottom surfaces of pattern are removed and spacers 3a are formed on the side wall surfaces of the photo resist template patterns 2.

Then, as shown in FIG. 1D, the photo resist template patterns 2 remaining between the spacers 3a are removed by selective etching and the bottom layer 1 is etched by using the spacers 3a as hard mask.

As single exposure lithography is very challenging in achieving 3× nm line widths and below, in the art a photo resist shrink step can be applied prior to the deposition of the spacer material as shown in FIG. 2A to FIG. 2E. Firstly, first photo resist template patterns 22 are formed on top of a bottom layer 11 as shown in FIG. 2A. Here, the ratio of line width X1 to spacing in between the lines of the first photo resist template patterns 22 is 1:A, wherein 1≦A<3. The photo resist template patterns 22 are trimmed so that the line width of the photo resist template patterns 22 shrinks to form the second photo resist template patterns 22a as shown in FIG. 2B. Here, the line width X2 is about ⅓ of the line spacing of the second photo resist template patterns 22a. The trimming can be performed by an oxygen plasma or by thermal annealing in an inert ambient or in an oxidizing or reducing ambient. The trimming can be performed in a separate chamber or in-situ, in the same chamber in which the spacer oxide deposition is performed without removing the substrate from the chamber in between the trimming and deposition steps.

As shown in FIG. 2C, an oxide spacer conformal 33 is deposited on the second photo resist template patterns 22a. Here, the thickness of the oxide film 33 is equal to the width of the second photo resist template patterns 22a. The deposited spacer oxide film 33 is etched back by RIE (reactive ion etching) such that the film 33 on the upper and bottom surfaces of patterns 22a are removed and film on the side wall surfaces of the patterns 22a remain to be spacers 33a as shown in FIG. 2D. Then, as shown in FIG. 2E, the second photo resist template patterns 22a remaining between spacers 33a are removed by selective etching so that the spacers 33a remain and then the bottom layer 11 is patterned by using the spacers 33a as a hard mask (HM).

Through the above described sequence, the number of lines having the same width as the lines of the template after trimming is doubled and the pitch is halved. Instead of a spacer oxide, an alternative material, such as an oxynitride or a nitride material with suitable properties, could be selected.

If the target Critical Dimension of lines is getting smaller than 30 nm, it will become difficult to control the uniformity of the amount of shrinking of such a photo resist shrink step or trimming step. Furthermore, there is a higher chance of patterning failure due to the leaning or collapsing of photo resist line due to the weak footing of the photo resist line when the photo resist line becomes narrower by the trimming.

SUMMARY OF THE INVENTION

The purpose of the invention is to secure measures to solve the problems which could occur in performing such a trimming step and to provide a Spacer Defined Double Patterning processes for 3×nm and below that avoids the problems discussed above.

To solve the problems, trimming is performed simultaneously with the process of depositing the spacer oxide. In an alternative embodiment, a first part of the trimming is performed in-situ, immediately before the spacer oxide deposition process in the same chamber in which the spacer oxide deposition is performed whereas a second part of the trimming is performed simultaneously with the process of depositing the spacer oxide. The present invention also provides a method to reduce PR footing during PR trimming with direct plasma exposure.

In an embodiment of the invention, trimming is performed simultaneously with the process of depositing the spacer oxide. The spacer oxide deposition process is a Plasma Enhanced Atomic Layer Deposition process.

In another embodiment of the invention, a first part of the trimming is performed in-situ, immediately before the spacer oxide deposition process in the same chamber in which the spacer oxide deposition is performed whereas a second part of the trimming is performed simultaneously with the process of depositing the spacer oxide. The first part of the trimming is preferably performed by a continuous oxygen plasma or by a pulsed oxygen plasma. The spacer oxide deposition process is a Plasma Enhanced Atomic Layer deposition process.

In another embodiment of the invention, PR trimming process under direct plasma makes PR footing reduce. This process includes two steps: a first step of PR trimming under direct plasma environment without supplying a precursor, a second step of deposition of $SiO_2$ film. In a direct plasma generated between a susceptor electrode grounded on earth on which the substrate is placed and an opposing electrode such as a shower head electrode, activated ions are accelerated in a vertical direction towards the substrate placed on the susceptor electrode and lead to higher trimming rate towards vertical direction than horizontal direction on the PR so that PR footing remaining in the bottom of PR is reduced.

BRIEF DESCRIPTION OF THE DRAWINGS

The present invention will become more apparent by describing embodiments thereof in detail with reference to the accompanying drawing in which:

FIG. 6 shows process sequence according to FIGS. 5A-5C.

DETAILED DESCRIPTION OF EMBODIMENTS

Figure 1A:
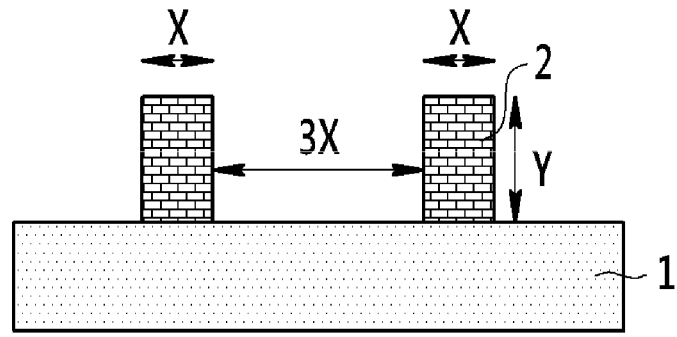
FIG. 1A to FIG. 1D show a Prior Art method of Spacer Defined Double Patterning without trimming.
Figure 1B:
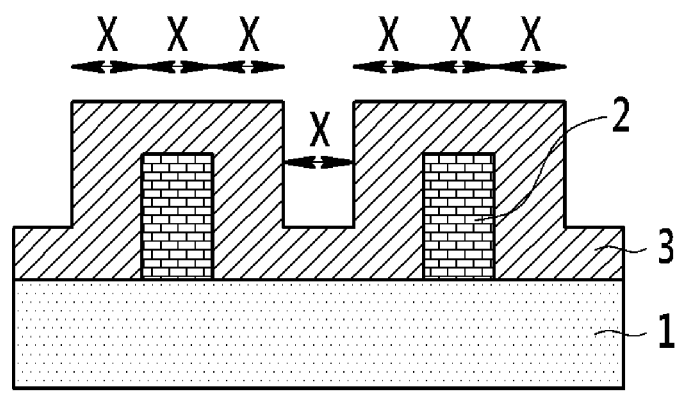
Figure 1C:
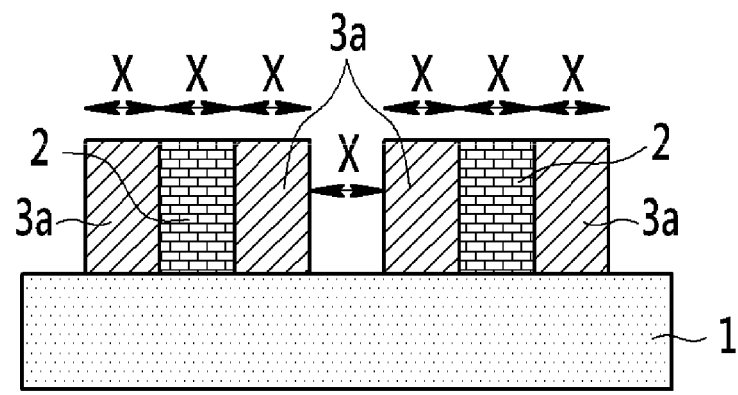
Figure 1D:
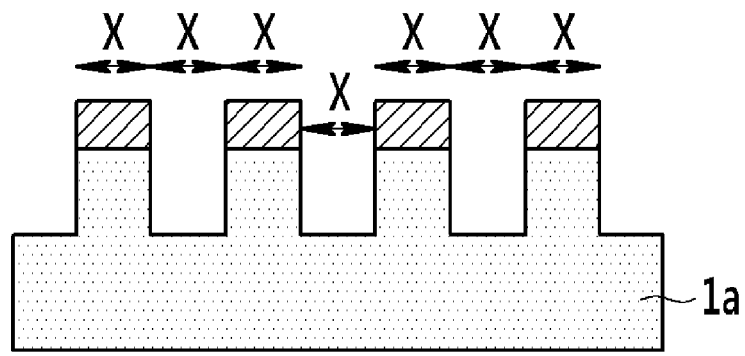
Figure 2A:
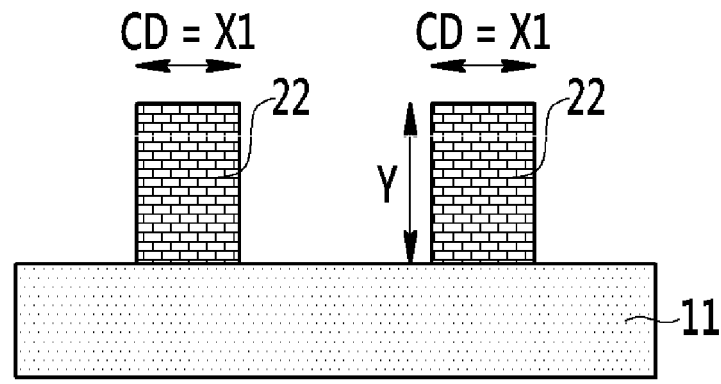
FIG. 2a to FIG. 2E show a Prior Art method of Spacer Defined Double Patterning with trimming prior to spacer deposition.
Figure 2B:
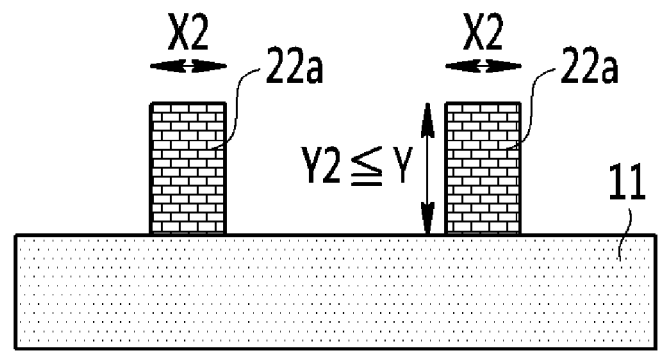
Figure 2C:
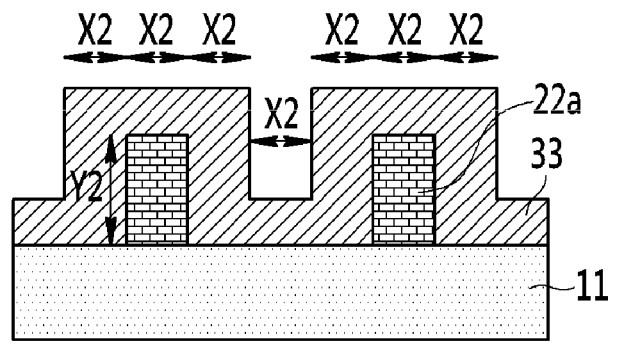
Figure 2D:
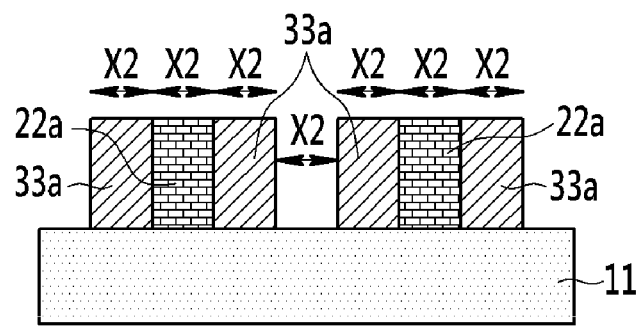
Figure 2E:
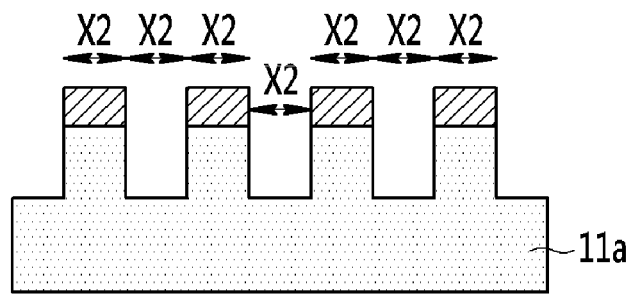

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 3A:
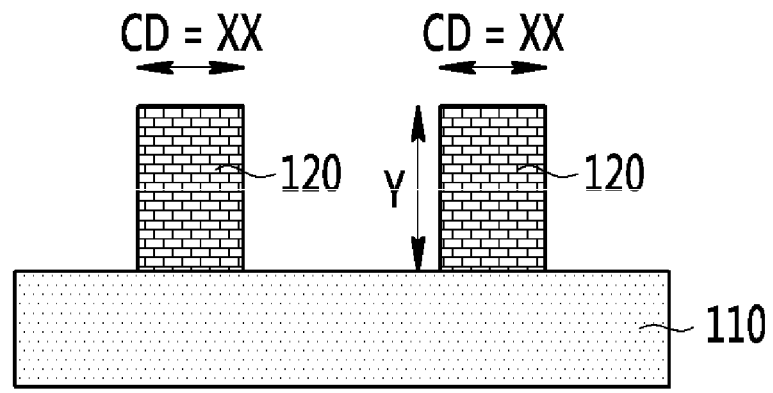
FIG. 3A to FIG. 3D show an embodiment of the present invention wherein trimming is preformed during the deposition of the spacer oxide.

FIG. 3A to FIG. 3D show an embodiment of the present invention wherein trimming is simultaneously preformed during the deposition of the spacer oxide. As shown in FIG. 3A, first photo resist or carbon based material template patterns 120 are on top of a bottom layer 110. Here, the ratio of line width XX to line spacing of the first photo resist template patterns 120 is 1: A ($1 \leq A < 3$).

Figure 3B:
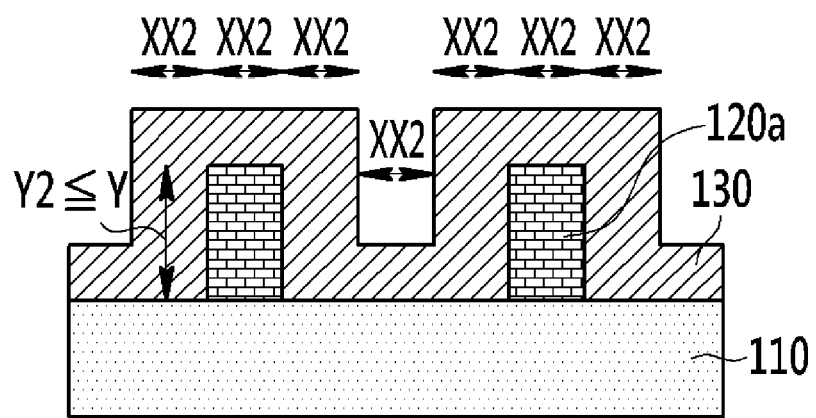

As shown in FIG. 3B, a spacer oxide film 130 is deposited on the formed first photo resist template patterns 120 and simultaneously second photo resist template patterns 120a having a width XX2 and a height Y2 that is smaller than the width XX and the height Y of the first photo resist template patterns 120 are formed, using a Plasma Enhanced Atomic Layer Deposition process using sequential and alternating pulses of source gas such as a silicon precursor and reactant such as $O_2$ plasma. In this step, the $O_2$ plasma should be provided with a condition that: (i) the first template patterns 120 can be etched with a certain etching rate such that the first photo resist template patterns 120 are trimmed to form the second photo resist template patterns 120a and (ii) oxygen radical can be reacted with a precursor deposited previously on the substrate to form the spacer oxide film 130 such as $SiO_2$ film by PEALD method. At the end of this step, a ratio of the line width to line spacing of the second photo resist template patterns 120a should be 1:3 and the thickness of the deposited spacer oxide film 130 should be equal to the width of the second photo resist template patterns 120a. The $O_2$ plasma may be a direct plasma wherein the plasma is generated immediately adjacent to the substrate or a remote plasma.

Figure 3C:
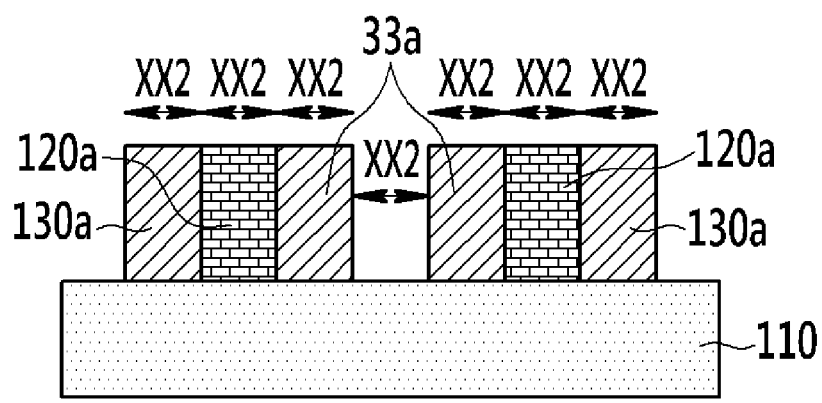

Then, the deposited spacer oxide film 130 is etched back by RIE such that the deposited spacer oxide film 130 on the upper and bottom surfaces of patterns 120a is removed and the deposited spacer oxide film 130 on the side wall surfaces of the patterns 120a remains to be spacers 130a as shown in FIG. 3C.

Figure 3D:
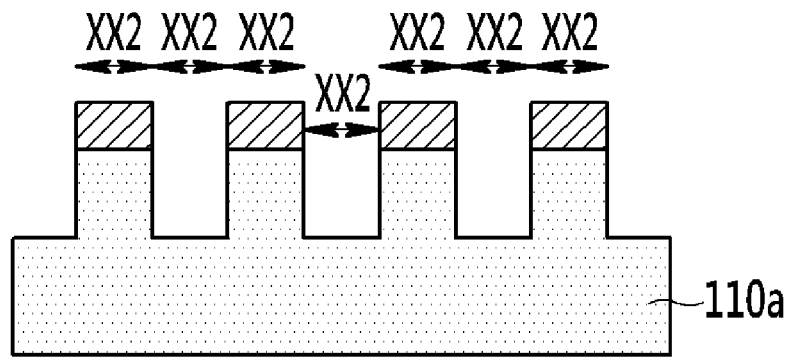

Subsequently, as shown in FIG. 3D, the second photo resist template patterns 120a remaining between the spacers 130a are removed by selective etching such that the spacers 130a remain. Then, the bottom layer 110 is patterned by using the spacers 130a as a hard mask (HM).

Figure 4A:
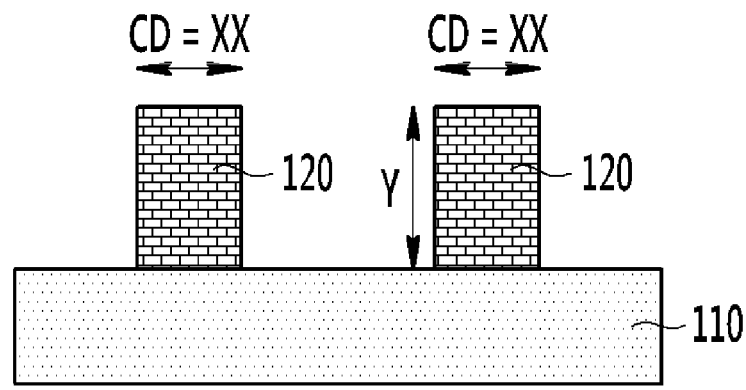
FIG. 4A to FIG. 4E show another embodiment of the present invention wherein trimming is performed both prior to and during the deposition of the spacer oxide.

FIG. 4A to FIG. 4E show another embodiment of the present invention wherein trimming is simultaneously preformed during the deposition of the spacer oxide film. Firstly, as shown in FIG. 4A, first photo resist or carbon based material template patterns 120 are formed on top of a bottom layer 110. Here, the ratio of line width XX to spacing in between the lines of the first photo resist template patterns 120 is 1: A ($1 \leq A < 3$).

Figure 4B:
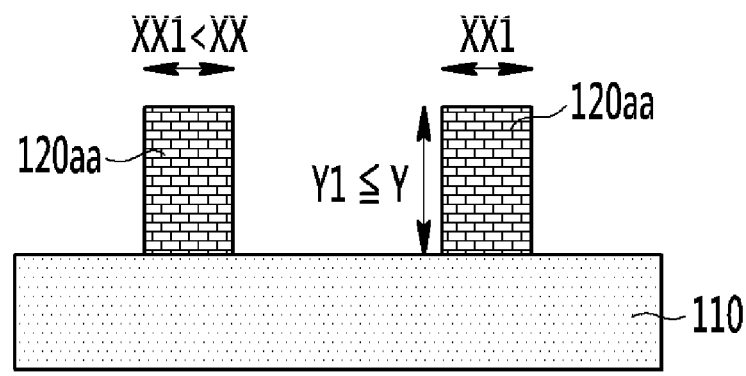

Next, as shown in FIG. 4B, the first photo resist template patterns 120 are firstly trimmed so that the line width shrinks to form third photo resist template patterns 120aa having a line width XX1 (wherein XX1<XX). Here, the ratio of line width XX1 to spacing in between the lines of the third photo resist template patterns 120aa is 1: B (wherein A<B<3). The first trimming can be performed by an oxygen plasma (direct plasma or remote plasma) or by thermal annealing in an inert ambient or in an oxidizing or reducing ambient. Preferably, the first trimming is performed in-situ, in the same chamber in which the spacer oxide deposition is performed without removing the substrate from the chamber between the trimming and deposition steps.

Figure 4C:
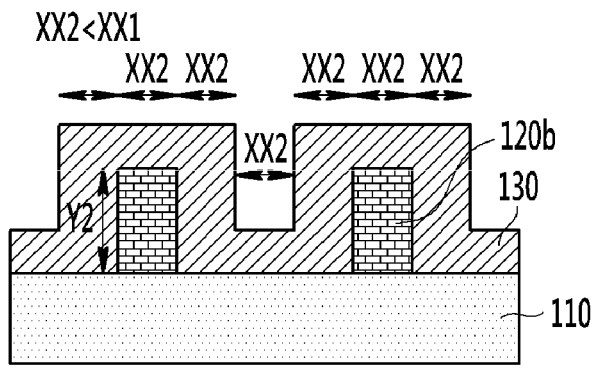

Next, as shown in FIG. 4C, a spacer oxide film 130 is deposited on the third photo resist template patterns 120aa and the third photo resist template patterns 120aa are simultaneously secondly trimmed so that fourth photo resist template patterns 120b having a width XX2 and a height Y2 that is smaller than the width XX1, the height Y of the first photo resist template patterns 120, and the height Y1 of the third photo resist template patterns 120aa are formed, using a Plasma Enhanced Atomic Layer Deposition process using sequential and alternating pulses of source gas such as a silicon precursor and reactant such as $O_2$ plasma. In this step, the $O_2$ plasma should be provided with a condition that: (i) the third template patterns 120aa can be etched with a certain etching rate such that the third template patterns 120aa are trimmed to form the fourth photo resist template patterns 120b and (ii) oxygen radical can be reacted with precursor deposited previously on the substrate to form the spacer oxide film 130 such as $SiO_2$ film by PEALD method. At the end of this step, the photo resist pattern lines have shrunk to a width XX2 (wherein XX2<XX1) and the ratio of line width XX2 to line spacing should be 1:3 and the thickness of the deposited spacer oxide film 130 should be equal to width XX2 of the fourth photo resist template patterns 120b. Here, the $O_2$ plasma may be a direct plasma or a remote plasma.

Figure 4D:
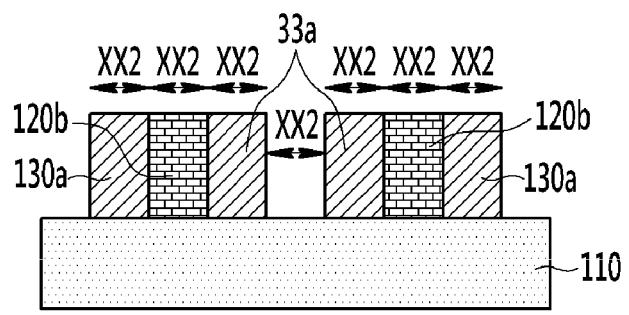

As shown in FIG. 4D, the deposited spacer oxide film 130 is etched back by RIE such that the film 130 on the upper and bottom surfaces of the fourth photo resist template patterns 120b are removed and the film 130 remains on the side wall surfaces of the fourth photo resist template patterns 120b to be spacers 130a.

Figure 4E:
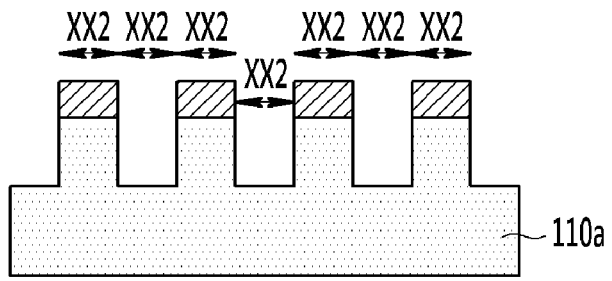

As shown in FIG. 4E, the fourth photo resist template patterns 120b remaining between the spacers 130a are removed by selective etching such that the spacers 130a remain. Then, the bottom layer 110 is patterned by using the spacers 130a as a hard mask (HM).

The trimming of the photo resist template patterns during the PEALD process of the spacer oxide film might occur in particular during the initial cycles of the deposition process. When multiple cycles of the spacer oxide have been deposited, the photo resist template patterns might be protected from the $O_2$ plasma so that further etching and shrinking of the photo resist does not occur anymore and only spacer oxide deposition occurs. The conditions of the spacer oxide deposition process and an eventual trimming step prior to the spacer oxide deposition should be selected such that after completion of the spacer oxide template: line width=line space=film thickness.

EXPERIMENTAL EXAMPLE 1

A $SiO_2$ film deposition by PEALD on photo resist template patterns is carried out with the following conditions.

Metalorganic precursors or halosilane precursors containing Si can be used as Si precursors. In the present invention, for example, $SiH_2[N(C_2H_5)_2]_2$ was used as a Si precursor. Susceptor temperature for heating substrate varied from room temperature to 200 degree C., preferably the susceptor temperature was 50 degree C. During deposition, process pressure is maintained in a range from 1 to 10 Torr, preferably at a value of about 3 Torr. RF plasma power is in a range from 10 to 1000 W, preferably at a value of about 200 W.

Gas flow condition is as follows.

Source Ar flow rate for carrying bubbled precursor into reactor: 200 sccm

Temperature of precursor container: 60° C.

$O_2$ reactant flow rate: 50 sccm

Reactant Ar flow rate for flowing into reactor with oxygen: 200 sccm

Main Ar flow rate for chamber/gas line purge: 200 sccm

Process time per cycle is as follows.

Source feeding/Purge/Plasma/Purge=1.0/1.0/0.3/1.0 (unit: second)

In the above sequence, oxygen is continuously provided during all steps of the cycle and activated when plasma is provided. When not activated by the plasma, the oxygen is not reactive and just acts as a purge gas. In an alternative embodiment, the oxygen can also be provided intermittently, synchronously with the plasma pulses. The above cycle is repeated until a target thickness is achieved. The deposited film thickness per cycle is about 0.12 nm.

For a photo resist trimming step prior to the PEALD deposition step, similar conditions can be used as during the PEALD step but without flowing the Silicon precursor. The photo resist film thickness reduction for a blanket photo resist layer would be about 0.25 nm per cycle. Then, after a number of cycles comprising oxygen plasma pulses resulting in an initial thinning of the photo resist lines, the Silicon precursor flow can be switched on and some additional photo resist line width reduction can be obtained during the PEALD deposition step. In a first example, the width of the photo resist lines, or critical dimension (CD) directly after lithography is 40 nm and the line spacing is also 40 nm. During an in-situ trimming step prior to deposition, a CD reduction down to 25 nm is achieved. In a subsequent spacer deposition step of 20 nm thickness, an additional reduction of the CD from 25 nm down to 20 nm is achieved. In a second example, the critical dimension of the photo resist lines is 30 nm directly after lithography and the line spacing is 30 nm. During an in-situ trimming step prior to a spacer deposition step, a reduction of photo resist CD down to 20 nm is achieved. Then, during a 15 nm spacer oxide PEALD step, a further reduction of photo resist CD from 20 nm down to 15 nm is achieved.

Figure 5A:
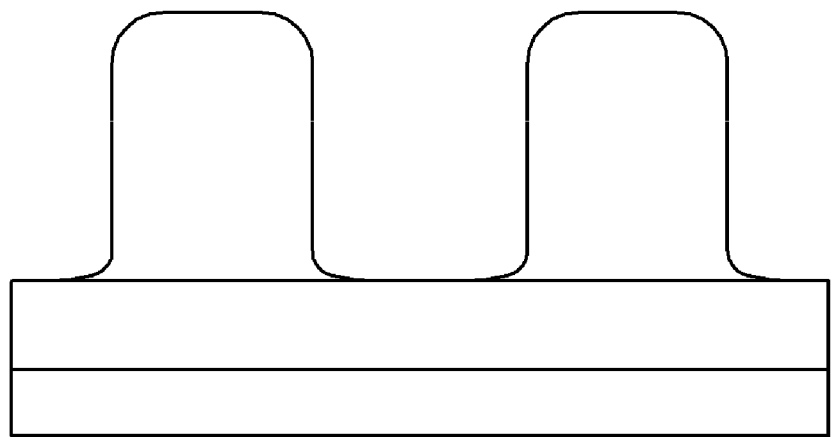
FIG. 5A to FIG. 5C show yet another embodiment of the present invention wherein PR trimming and PR footing reduction are performed simultaneously prior to the deposition of the spacer oxide.
Figure 5B:
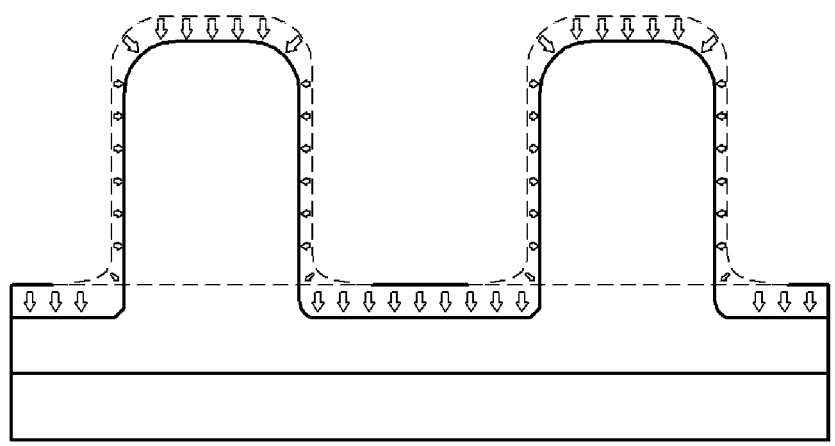
Figure 5C:
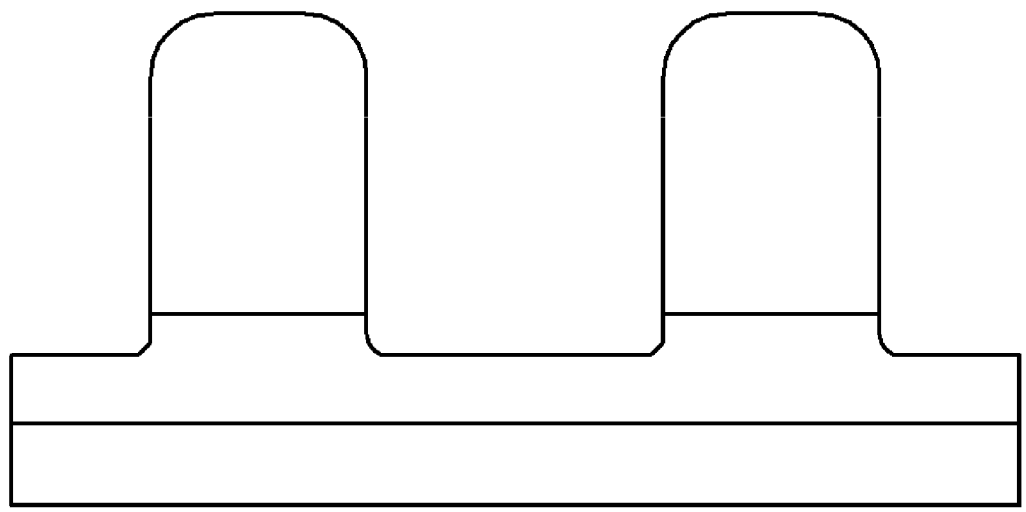

FIG. 5A to FIG. 5C show yet another embodiment of the present invention wherein PR trimming and PR footing reduction are performed simultaneously prior to the deposition of the spacer oxide. This embodiment is similar to the embodiment described right above. However, this embodiment further includes reduction step of PR (photo resist) footing prior to spacer oxide film deposition.

As shown in FIG. 5A, PR (photo resist) footing in the lower portions of the photo resist template pattern may be generated. During the trimming step, the PR pattern is exposed to a direct plasma in a PR footing reduction step so that activated ions like $O_2$ radical or Ar radical are accelerated towards the vertical direction, so trimming rate in the vertical direction (perpendicular to substrate and to electrode) is faster than in the horizontal direction (parallel to electrode) as shown in FIG. 5B. Therefore, the photo resist (PR) footing is reduced as shown in FIG. 5C. In this embodiment, the line width of the photo resist template patterns and the spacing between lines of the photo resist template patterns are in a ratio of 1:C (wherein $1 \leq C < 3$). In the example shown in FIG. 5C, C is about 1. This PR footing reduction step by direct plasma exposure results, in addition to footing reduction, to PR trimming and can also be considered as a PR resist trimming step with improved characteristics. This process is performed in the same reactor chamber as wherein deposition is performed. If the PR footing has been adequately removed in the PR footing reduction step, but additional trimming is needed, an additional trimming step without direct plasma exposure can be performed, either before or after the PR reduction step but prior to deposition.

EXPERIMENTAL EXAMPLE 2

A $SiO_2$ film deposition by PEALD on photo resist template patterns is carried out with the following conditions.

Metalorganic precursors or halosilane precursors containing Si can be used as Si precursors. In this invention, $SiH_2[N(C_2H_5)_2]_2$ was used as a Si precursor. Susceptor temperature for heating substrate varied from room temperature to 200 degree C., preferably the susceptor temperature was 50 degree C. During deposition, process pressure is maintained in a range from 1 to 10 Torr, preferably at a value of about 3 Torr. RF plasma power is in a range from 10 to 1000 W, preferably at a value of about 100 W to 150 W.

Gas flow condition:

Source Ar flow rate for carrying bubbled precursor into reactor: 500 sccm

Temperature of precursor container: 60° C.

$O_2$ reactant flow rate: 1000 sccm

Reactant Ar flow rate for flowing into reactor with oxygen: 500 sccm

Main Ar flow rate for chamber/gas line purge: 200 sccm

Reaction space gap between showerhead and substrate: 14.5 mm.

Processing time:

Pre-trimming step: <2.0 sec.

Deposition step time: <2.0 sec.

Plasma pulsing time: 0.2 sec

Purge time: 1.0 sec.

FIG. 6 shows process sequence according to FIGS. 5A to 5C. Cycle for pre-trimming step for PR footing reduction is repeated and deposition is performed after that. Reactant like $O_2$ is provided during the pre-trimming step and deposition step. Purge gas like Ar is provided during the deposition step. Plasma is provided intermittently during the pre-trimming step and deposition step.

The advantages of the present invention are as follows, compared to the case of performing trimming separately in advance.

If the template pattern (PR or carbon-based film) is trimmed to a width of 1×(10 to 19 nm) in a separate etching chamber, the reduction of width to height could lead to the weakening of the geometric structure, so the template pattern line could easily lean or collapse in the cleaning or wafer handling process after trimming. However, if the trimming and the film deposition are performed simultaneously according to the above described embodiments of the present invention, the deposited film can support the template pattern and the template pattern can maintain its shape or structure even if the width of the template pattern is thinned to the level of 10 nm.

Combining the trimming and the deposition process results in a simpler and more efficient process.

In ALD, the coverage of deposited material on the substrate changes gradually from 0% to 100% (full coverage) along the number of deposition cycles. As the coverage changes along the deposition, the simultaneously etching of a layer on which the spacer oxide film is deposited (photo resist or carbon template patterns in this invention) reduces and the apparent etching rate decelerates from a certain etching rate to zero etching rate. This deceleration of etching rate would help to control the very fine CD of the photo resist template patterns or carbon line. In prior art of dry etching, it would be very difficult to control the etching amount precisely with controlled time. If the overall etching rate is low, it would impact on the productivity, and if the etching rate is fast, it would impact on the controllability of CD. But, according to the present invention, by implementing the simultaneous etching and deposition, the sufficient etching rate at initial stage and sufficient controllability of CD can be achieved due to the variation of etching rate from high to low (deceleration effect) as the spacer oxide coverage gets close to the full coverage starting from zero coverage.

PR trimming process under direct plasma prior to deposition step leads to the reduction of PR footing as activated species is accelerated more towards the vertical direction than the horizontal direction on PR so that trimming rate is faster in the vertical direction than the horizontal direction on PR. This leads to better trimming and improves film uniformity in the deposition step.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of forming semiconductor patterns, the method comprising:
   forming a photo resist template having a pattern of lines on a bottom layer, the pattern having a line width and a line spacing, the ratio of the line width to the line spacing being 1:A wherein 1≦A<3;
   depositing a spacer oxide conformal over the photo resist template by a Plasma Enhanced Atomic Layer deposition process, using sequential and alternating pulses of a silicon precursor and an oxygen plasma, such that trimming of the photo resist template occurs and the ratio of the line width to the line spacing becomes 1:3 and the thickness of the deposited spacer oxide is about equal to the trimmed line width, wherein the silicon precursor is $SiH_2[N(C_2H_5)_2]_2$;
   etching back the deposited spacer oxide such that spacer oxide films on upper and bottom surfaces of the pattern are removed, with spacer oxide films on side wall surfaces of the photo resist template remaining;
   removing the photo resist template remaining between the spacer oxide films by selective etching; and
   patterning the bottom layer by using the remaining spacer oxide films formed as mask.

2. The method of claim 1, further comprising:
   trimming, prior to the step of depositing the spacer oxide, the photo resist pattern of lines such that the ratio of the line width to the line spacing becomes 1:B, wherein A<B<3 by exposing the photo resist pattern of lines to pulses of the oxygen plasma, in the same reaction chamber in which the spacer oxide deposition is performed.

3. The method of claim 2, further comprising:
   a PR footing reduction step prior to the step of depositing the spacer oxide, in the same reaction chamber in which PR trimming step and the spacer oxide deposition step are performed, the PR footing reduction step comprising a direct plasma exposure step.

4. The method of claim 2, wherein the plasma is a direct plasma.

5. The method of claim 2, wherein the plasma is a remote plasma.

6. The method of claim 3, wherein the PR footing reduction step is performed prior to the PR trimming step.

7. The method of claim 3, wherein the PR footing reduction step is performed after the PR trimming step.

8. The method of claim 3, wherein the PR footing reduction step and the PR trimming step are performed simultaneously.

9. The method of claim 1, wherein the plasma is a direct plasma.

10. The method of claim 1, wherein the plasma is a remote plasma.

11. A method of forming semiconductor patterns, the method comprising:
    forming a photo resist template having a pattern of lines on a bottom layer, the pattern having a line width and a line spacing, the ratio of the line width to the line spacing being 1:A wherein 1≦A<3;
    a photo resist footing reduction step comprising a direct plasma exposure step;
    after performing the photo resist footing reduction step, trimming the photo resist pattern of lines such that the ratio of the line width to the line spacing becomes 1:B, wherein A<B<3, by exposing the photo resist pattern of lines to pulses of an oxygen plasma;
    after trimming the photo resist pattern of lines, depositing a spacer oxide conformal over the photo resist template by a Plasma Enhanced Atomic Layer deposition process, using sequential and alternating pulses of a silicon precursor and the oxygen plasma, such that trimming of the photo resist template occurs and the ratio of the line width to the line spacing becomes 1:3 and the thickness of the deposited spacer oxide is about equal to the trimmed line width;
    etching back the deposited spacer oxide such that spacer oxide films on upper and bottom surfaces of the pattern are removed, with spacer oxide films on side wall surfaces of the photo resist template remaining;
    removing the photo resist template remaining between the spacer oxide films by selective etching; and
    patterning the bottom layer by using the remaining spacer oxide films formed as mask,
    wherein trimming the photo resist, depositing the spacer oxide, and the photo resist footing reduction step are performed in a common reaction chamber.

12. The method of claim 11, wherein the plasma is a direct plasma.

13. The method of claim 11, wherein the plasma is a remote plasma.

14. The method of claim 11, wherein the silicon precursor is $SiH_2[N(C_2H_5)_2]_2$.

* * * * *